United States Patent
Simon et al.

(10) Patent No.: US 9,935,405 B2
(45) Date of Patent: Apr. 3, 2018

(54) TERMINAL BLOCK, CONNECTION APPARATUS FORMED THEREWITH, AND FIELD DEVICE WITH SUCH A CONNECTION APPARATUS

(71) Applicant: ENDRESS + HAUSER FLOWTEC AG, Reinach (CH)

(72) Inventors: Antoine Simon, St. Louis (FR); Roland Roth, Laufen (CH); Frantz Bindler, Fortschwihr (FR)

(73) Assignee: ENDRESS + HAUSER FLOWTEC AG, Reinach (CH)

( * ) Notice: Subject to any disclaimer, the term of this patent is extended or adjusted under 35 U.S.C. 154(b) by 0 days.

(21) Appl. No.: 15/581,562

(22) Filed: Apr. 28, 2017

(65) Prior Publication Data

US 2017/0229819 A1   Aug. 10, 2017

Related U.S. Application Data

(63) Continuation of application No. 14/400,054, filed as application No. PCT/EP2013/058568 on Apr. 25, 2013, now abandoned.

(30) Foreign Application Priority Data

May 16, 2012  (DE) .................. 10 2012 104 258

(51) Int. Cl.
*H01R 13/66* (2006.01)
*H01R 31/06* (2006.01)
(Continued)

(52) U.S. Cl.
CPC ......... *H01R 13/6616* (2013.01); *G01D 11/00* (2013.01); *H01R 31/065* (2013.01); *H03K 17/60* (2013.01); *H03K 17/687* (2013.01)

(58) Field of Classification Search
CPC ...... H01R 9/24; H01R 9/2425; H01R 9/2458; H01R 9/2466; H01R 13/6616;
(Continued)

(56) References Cited

FOREIGN PATENT DOCUMENTS

| DE | 102005062259 | * | 7/2007 | ............. H03K 17/94 |
| DE | 102008034078 | * | 1/2010 | ......... H01R 13/6616 |

\* cited by examiner

*Primary Examiner* — Khiem Nguyen
(74) *Attorney, Agent, or Firm* — Bacon & Thomas, PLLC

(57) ABSTRACT

The terminal block (10) serves for electrically connecting a connection line having at least two conductors (L1, L2) and extending externally of an electronics housing (H). The terminal block comprises a platform (100) composed at least partially of an electrically insulating, synthetic material, especially a synthetic material having a dielectric strength sufficient to meet European standard EN 60947-1, a connection terminal (T1) arranged on a first side of the platform forming a first connection side of the terminal block and serving for connection of a conductor (L1) of the connection line as well as at least one connection terminal (T2) arranged on the first side of the platform, laterally spaced from the connection terminal (T1) for connection of a conductor (L2) of the connection line. Additionally, the terminal block comprises a connection contactor (J1) arranged on a second side of the platform forming a second connection side of the terminal block, e.g. especially a connection contactor embodied as a contact pin or as a contact jack, as well as a connection contactor (J2) arranged on the second side of the platform and laterally spaced from the connection contactor (J1), e.g. a connection contactor embodied as a contact pin or as a contact jack.

15 Claims, 2 Drawing Sheets

Figure 1:
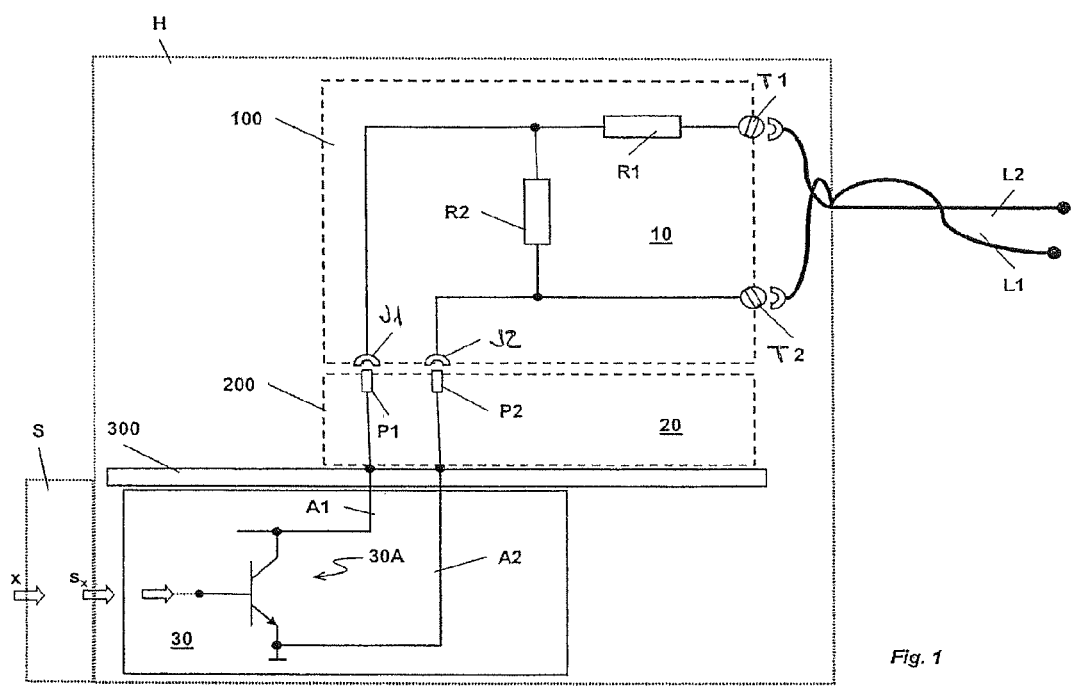

(51) Int. Cl.
 *G01D 11/00* (2006.01)
 *H03K 17/60* (2006.01)
 *H03K 17/687* (2006.01)
(58) Field of Classification Search
 CPC ...... H01R 31/065; G01D 11/00; H03K 17/60;
 H03K 17/687
 See application file for complete search history.

TERMINAL BLOCK, CONNECTION APPARATUS FORMED THEREWITH, AND FIELD DEVICE WITH SUCH A CONNECTION APPARATUS

CROSS REFERENCE TO RELATED APPLICATIONS

This application is a Continuation application of U.S. patent application Ser. No. 14/004,054, filed on Nov. 10, 2014, which claims priority to International application no. PCT/EP2013/058568, filed on Apr. 25, 2013, which claims priority to German application no. 10 2012 104 258.6, filed on May 16, 2012 (of which the entire disclosure of the pending, prior application is hereby incorporated by reference).

The invention relates to a terminal block for electrically connecting a connection line having at least two conductors as well as to a connection apparatus formed with such a terminal block for electrically connecting a field device circuit accommodated in an electronics housing with a connection line extended externally of the electronics housing. Furthermore, the invention relates to a field device having such a connection apparatus, for example, a field device embodied as a measuring and/or switch device.

Applied in industrial process measurements technology, especially also in connection with the automation of chemical processes or procedures for producing a product from a raw or starting material by use of chemical, physical or biological processes and/or the automated control of industrial plants, are so-called field devices, namely electrical measuring and/or switch devices installed directly at the respective plant. Such devices include e.g. Coriolis, mass flow, measuring devices, density measuring devices, magneto inductive, flow measuring devices, vortex, flow measuring devices, ultrasonic, flow measuring devices, thermal, mass flow measuring devices, pressure measuring devices, fill level measuring devices, fill level limit switches, temperature measuring devices, pH-value measuring devices, etc., which serve for producing process variables—analog or, for example, also digital variables—representing measured values as well as for producing the measured value signals lastly carrying such variables. The process variables respectively to be registered can include, depending on application, for example, a mass flow, a density, a viscosity, a fill level or a limit level, a pressure or a temperature or the like, of a liquid, powdered, vaporous or gaseous medium, which is conveyed, respectively held, in a corresponding container, such as e.g. a pipeline or a tank.

For registering the respective process variables and for transducing the same into an electrical measurement signal corresponding thereto, field devices have a corresponding physical to electrical or chemical to electrical, measuring transducer, which is most often mounted directly in a wall of the container containing the medium or in the course of a line, for example, a pipeline, conveying the medium.

For processing the measurement signal, the measuring transducer is further connected with a measuring device internal, operating and evaluating circuit provided in an electronics of the field device and serving for further processing or evaluating the at least one measurement signal, as well as also for generating corresponding measured values. Examples of such measuring systems known, per se, to those skilled in the art are disclosed in WO-A 88/02853, WO-A 88/02476, U.S. Pat. No. 6,452,493, US-A 2011/0317390, EP-A 816 807, EP-A 1 591 977 or DE-A 10 2008 052 912, respectively available from the applicant, for example, under the marks FLOWPHANT®T DTT31, t-switch ATT11, t-trend ATT12, Magphant DTI200, Promag 53H, Prowirl 73F, Promass 83X, or Promass 84F.

The particular electronics of the respective field device is, most often, accommodated in a comparatively robust, for instance, impact-, pressure-, explosion- and/or weather resistant, electronics housing. The electronics housing can be arranged e.g. removed from the field device and connected with such only via a flexible cable; the electronics housing can, however, also be arranged directly on the measuring transducer or on a measuring transducer housing separately housing the measuring transducer.

In the case of a large number of field devices used in industrial measurements technology, the measuring transducer is so driven at least at times by a driver signal generated by the operating and evaluating circuit for producing the measurement signal during operation that it acts in a manner suitable for the measuring at least indirectly or, via a probe directly contacting the medium, practically directly on the medium, in order to bring about reactions corresponding to the measured variable to be registered. The driver signal can, in such case, be correspondingly controlled, for example, as regards an electrical current level, a voltage level and/or a frequency. Examples of such active measuring transducers, thus measuring transducers correspondingly using an electrical driver signal, include, especially, flow measuring transducers serving for measuring media flowing at least at times, e.g. measuring transducers with at least one coil driven by the driver signal for producing a magnetic field or with at least one ultrasonic transmitter driven by the driver signal, or, however, also fill level and/or limit level transducers serving for measuring and/or monitoring fill levels in a container, such as e.g. transducers with a freely radiating microwave antenna, a Goubau line or a vibrating, immersion element.

The measured values generated by the operating and evaluating circuit are provided at corresponding circuit outputs in the form of electrical—digital or analog—measured value signals, for example, in the form of an analog signal current correspondingly modulated in the range of 4-20 mA. Moreover, also usual for providing measured values are so-called frequency outputs, namely circuit outputs coding the measured values in a pulse sequence frequency of a binary, rectangular signal, or also so-called pulse outputs, namely circuit outputs in the form of a pulse signaling the reaching of an earlier selectable measure of quantity. Besides field devices with measuring transducers serving principally for registering a physical or chemical variable, there are additionally also field devices embodied, for example, as electric motor driven, actuator valves or pumps, which are provided, especially, for adjusting one or more physical, process parameters, consequently actively interacting with the respective process, supplementally, however, also making available internal, measuring and/or setting values on corresponding circuit outputs.

Besides circuit outputs of the aforementioned type providing measured values, modern field devices can, at times, also have so-called status, respectively alarm, outputs and/or also circuit outputs serving for directly activating external electrical devices, such as relays, directly connected to the field device. Such circuit outputs can be implemented as passive circuit outputs, namely in the form of a circuit output forming part of an electrical circuit driven by a voltage source stationed externally of the field device, or also as active circuit outputs, namely in the form of a circuit output forming part of an electrical circuit driven by a voltage source internal to the field device. Alternatively or supplementally, field devices can also have circuit outputs for connecting to a fieldbus, for example, a serial fieldbus.

For connecting internal electronic circuits, not least of all also circuits having circuit outputs of the initially mentioned type, with one or more external electrical circuits, field devices have most often connection systems formed by means of a terminal block for electrically connecting a connection line of two or more conductors brought from the exterior to the field device.

Field devices of the type being discussed have, from time to time, one or more electrical circuit outputs, whose operation, respectively whose electrical parameters, such as, for instance, a particular output impedance, respectively a particular terminating resistance, can also be configured by the user, respectively on-site, suitably for a respective application. Representative of such configurable circuit outputs of field devices are, for example, the mentioned circuit outputs, formed, for example, by means of a bipolar transistor with "open" collector connection (open collector) or by means of a field effect transistor with "open" drain connection (open drain), for binary switching signals or also pulse outputs of binary clock signals. As a rule, these must have namely only two switch states sufficiently separated as regards a respectively flowing electrical current, thus provide only a sufficiently large and as constant as possible difference between the electrical current flow allowed respectively in the switch state for logic "0" (LOW) and that in the switch state for logic "1" (HIGH). For the special case, however, that said switch output should, for instance, be configured as a passive circuit output conforming to the European standard EN 60947-5-6:2000, it is additionally also to be assured that in the case of the connection conditions specified in said standard the electrical current flow in the switch state for logic "0" have an electrical current level, which lies within a therefor predetermined interval of 0.1 mA to 1 mA, and the electrical current flow in the switch state for logic "1" have an electrical current level, which lies within a predetermined electrical current interval of 2.2 mA to 8 mA. This can be achieved, for example, by connecting to the circuit output having a first connection at a first connection terminal of the terminal block supplementally a series resistance, for example, in the order of magnitude of 1 k$\Omega$, for limiting the maximum electrical current, as well as between a first connection either with the first connection terminal or with a second connection of the series resistance and a second connection with the second connection terminal a parallel resistance, for example, in the order of magnitude of 10 k$\Omega$, achieving the minimum electrical current for logic "0". If the standard does not have to be met, then the two resistances do not have to be provided.

For the purpose of bringing about such initial settings of functions or components, there are provided in conventional field devices most often short-circuiting plugs, so-called jumpers, for the selective connecting of circuit elements or also so-called DIP switches for the selective connecting, respectively disconnecting, of paths of the respective electronic circuits, wherein said short-circuiting plugs, respectively DIP switches, are, not least of all for reasons of space and cost, arranged most often in the immediate vicinity of the respective components, consequently directly on a circuit board carrying the particular circuit and in the immediate neighborhood also of other components of the electronic circuit. Although such adapting of circuit outputs by means of short-circuiting plugs, respectively DIP switches, must most often be performed only once or only very seldom, for instance, in the course of the initial electrical connecting of the respective field device to an external connection line, nevertheless a not insignificant risk is associated therewith that the electronics will be damaged thereby, for instance, as a result of electrostatic charges or mechanical effects.

Taking this into consideration, an object of the invention is to provide a connection system for a circuit output of an electronic circuit of a field device, respectively a terminal block therefor, whereby an accessing from the exterior into said circuit for the purpose of configuring the circuit output, for example, also for the purpose of a subsequent configuring on-site, for a circuit output meeting European standard EN 60947-5-6:2000 can be avoided.

For achieving the object, the invention resides in a terminal block for electrically connecting a connection line having at least two conductors, for example, a connection line extending externally of an electronics housing. The terminal block of the invention comprises a platform composed at least partially of an electrically insulating, synthetic material, for example, a synthetic material having an dielectric strength sufficient to meet European standard EN 60947-1, for example, a synthetic material in the form of a plastic, a first connection terminal arranged on a first side of the platform forming a first connection side of the terminal block and serving for connection of a first conductor of the connection line, at least a second connection terminal arranged on the first side of the platform, laterally spaced from the first connection terminal and serving for connection of a second conductor of the connection line, a first connection contactor arranged on a second side of the platform forming a second connection side of the terminal block, for example, a first connection contactor embodied as a contact pin or as a contact jack, a second connection contactor arranged on the second side of the platform and laterally spaced from the first connection contactor, for example, a second connection contactor embodied as a contact pin or as a contact jack, a first resistance element arranged within the platform, for example, a first resistance element also embedded in synthetic material, wherein a first connection of the first resistance element is electrically connected with the first connection terminal and a second connection of the first resistance element is electrically connected with the first connection contactor, as well as a second resistance element arranged within the platform, for example, a second resistance element embedded in synthetic material, wherein a first connection of the second resistance element is electrically connected with the first connection terminal or with the first connection contactor and a second connection of the second resistance element is electrically connected both with the second connection terminal as well as also with the second connection contactor.

Moreover, the invention resides also in a connection apparatus with such a terminal block for electrically connecting a field device circuit accommodated in an electronics housing with a connection line extending externally of the electronics housing, wherein the connection apparatus of the invention comprises besides said terminal block a connection base for the terminal block, wherein the connection base is composed at least partially of an electrically insulating, synthetic material, for example, a synthetic material in the form of a plastic.

Furthermore, the invention resides in a field device, for example, a field device formed as a measuring and/or switch device, comprising such a connection apparatus and an electronic circuit electrically connected with said connection apparatus.

In a first embodiment of the terminal block of the invention, it is provided that the first resistance element has an ohmic resistance of greater than 0.9 kΩ and less than 1.1 kΩ.

In a second embodiment of the terminal block of the invention, it is provided that the second resistance element has an ohmic resistance of greater than 9 kΩ and less than 11 kΩ.

In a third embodiment of the terminal block of the invention, it is provided that the second resistance element has an ohmic resistance, which is greater than 9-times an ohmic resistance of the first resistance element and less than 11-times the ohmic resistance of the first resistance element.

In a first embodiment of the connection apparatus of the invention, the connection base comprises a platform composed at least partially of an electrically insulating, synthetic material, a first connection contactor arranged on a first side of the platform forming a first connection side of the connection base and complementary to the first connection contactor of the terminal block, as well as at least a second connection contactor arranged on the first side of the platform, laterally spaced from the first connection contactor and complementary to the second connection contactor of the terminal block.

In a second embodiment of the connection apparatus of the invention, it is provided that connection base and terminal block are mechanically connected with one another to form a pluggable, for example, also releasable, galvanic connection between the first connection contactor of the terminal block and the first connection contactor of the connection base as well as between the second connection contactor of the terminal block and the second connection contactor of the connection base.

In a third embodiment of the connection apparatus of the invention, it is provided that each of the two connection contactors of the connection base is electrically connected, for example, by material bonding, with a line of an electronic circuit, for example, a line formed as a conductive trace on a circuit board.

In a first embodiment of the field device of the invention, it is provided that the electronic circuit has two connection contactors embodied, for example, in each case, at least sectionally as a conductive trace on a circuit board and/or at least sectionally as conductive wire, wherein a first connection contactor of the two connection contactors is electrically connected with the first connection contactor of the connection base and a second connection contactor of the two connection contactors is electrically connected with the second connection contactor of the connection base, for example, by means of soldered connections.

In a second embodiment of the field device of the invention, it is provided that the electronic circuit has a circuit output, for example, one formed by means of a transistor and/or a passive circuit output, with a first output contactor electrically connected with the first connection contactor of the connection base and with a second output contactor electrically connected with the second connection contactor of the connection base. Developing this embodiment of the invention further, it is, additionally, provided that, by means of the circuit output, the connection base and the terminal block, a switch output meeting the European standard EN 60947-5-6:2000 is formed.

In a third embodiment of the field device of the invention, it is provided that the electronic circuit has a bipolar transistor with a collector connection and with an emitter connection. Developing this embodiment of the invention further, it is, additionally, provided that, for instance, for forming a circuit output meeting European standard EN 60947-5-6:2000, the collector connection of the bipolar transistor is electrically connected with the first connection contactor of the connection base, consequently via the first resistance element with the first connection terminal of the terminal block, and the emitter connection of the bipolar transistor is electrically connected with the second connection contactor of the connection base, consequently with the second connection terminal of the terminal block.

In a fourth embodiment of the field device of the invention, it is provided that the electronic circuit has a field effect transistor with a source connection and a drain connection. Developing this embodiment of the invention further, it is, furthermore, provided that, for instance, for forming a circuit output meeting European standard EN 60947-5-6:2000, the drain connection of the field effect transistor is electrically connected with the first connection contactor of the connection base, consequently via the first resistance element with the first connection terminal of the terminal block, and the source connection of the field effect transistor is electrically connected with the second connection contactor of the connection base, consequently with the second connection terminal of the terminal block.

In a first further development of the field device of the invention, such additionally comprises an electronics housing, within which both the connection apparatus as well as also the electronic circuit are accommodated.

In a second further development of the field device of the invention, such additionally comprises a measuring transducer for producing at least one measurement signal dependent on a physical, measured variable to be registered.

According to a basic idea of the invention, additional resistances required for configuring circuit outputs of electronic circuits of field devices, for instance, for forming a circuit output meeting European standard EN 60947-5-6:2000, namely resistances addable, respectively removable, by means of short-circuiting plugs or DIP-switches, are not such as previously done, arranged directly on a circuit board, which bears the particular electronic circuit, respectively the electronic components forming its output, but, instead, are accommodated separated therefrom in a special terminal block connected via a connection base releasably with the remaining components of the electronic circuit. An advantage of the invention is, among other things, that said terminal block can, in turn, be replaced very simply with another terminal block, in given cases, even a terminal block without resistances or a terminal block with resistors having other resistance values, for example, even in the case of field devices already installed on-site, or, conversely, for instance, in the case that after installation of the field device a configuring of the circuit output according to European standard EN 60947-5-6:2000 is required, in which case said circuit output can be retrofitted very simply by means of a special terminal block containing the corresponding resistances.

Figure 2:
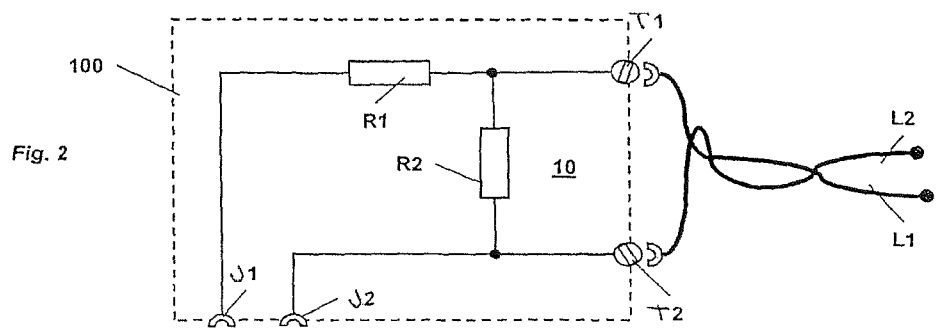
Figure 3:
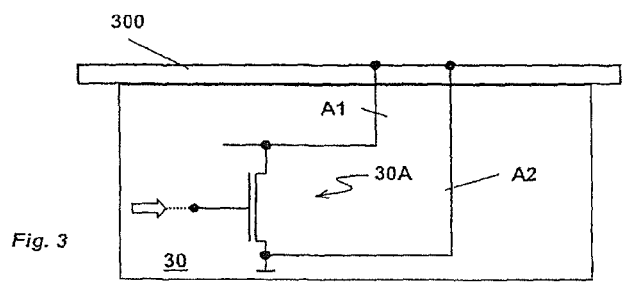

The invention as well as other advantageous embodiments thereof will now be explained in greater detail based on examples of embodiments presented in the figures of the drawing. Equal parts are provided in all figures with equal reference characters; when perspicuity requires or it otherwise appears sensible, already mentioned reference characters are omitted in subsequent figures. Other advantageous embodiments or further developments, especially also combinations of initially only individually explained aspects of the invention, will become evident, furthermore, from the figures of the drawing, as well as also from the dependent claims per se. The figures of the drawing show as follows:

FIG. 1 schematically, a field device embodied, for example, as an industrial measuring and/or switch device;

FIG. 2 schematically, a variant of a terminal block suitable for the field device of FIG. 1; and FIG. 3 schematically, a variant of a circuit output suitable for the field device of FIG. 1.

FIG. 1 shows, schematically, a field device with an electronic circuit 30 accommodated within an electronics housing H. Electronic circuit 30 is formed at least partially by means of semiconductor elements. The field device can be embodied, for example, as a measuring and/or switch device suitable for industrial automation technology and/or, such as indicated in FIG. 1, can have a measuring transducer S connected to the circuit 30 and serving for producing at least one measurement signal $s_x$ dependent on a physical, measured variable x to be registered.

Electronic circuit 30 includes a circuit output 30A, for example, one formed by means of a transistor, having a first output contactor A1 and a second output contactor A2. Each of the two output contactors A1, A2 can be embodied e.g., at least sectionally, as a conductive trace on a circuit board 300 at least partially carrying the electronic circuit 30 and/or, at least sectionally, as a conductive wire. Circuit output can, in turn, be, for example, a frequency output for outputting a binary, rectangular signal having a pulse sequence frequency representing the measured variable x, respectively its time curve, and encoding measured values, or it can be, for example, a pulse output for outputting pulses, which signal the reaching of an earlier selectable size of the measured variable x. The circuit output can, however, for example, also be configured as a status- or alarm output and/or also serve for the direct activating of external electrical devices connected to the field device, consequently serving as a relay actuator. The circuit output can, for example, also be a passive, switch output or, however, also be adapted as a connection to a fieldbus, for example, a serial fieldbus.

In the example of an embodiment shown in FIG. 1, circuit output 30A is, for example, for the purpose of forming an open collector output, formed by means of a bipolar transistor, wherein a collector connection of the bipolar transistor forms the connection contactor A1 of the electronic circuit 30 and an emitter connection of the bipolar transistor forms the connection contactor A2 of the electronic circuit 30. Alternatively or in supplementation, the circuit output 30A can, such as schematically presented in FIG. 3, be formed, for example, also by means of a field effect transistor with a source connection and a drain connection, for example, in such a manner that, for forming an open drain output, the first connection contactor A1 of the electronic circuit 30 is formed by means of the drain connection and the second connection contactor A2 of the electronic circuit 30 is formed by means of the source connection.

For electrically connecting the circuit output 30A, consequently the electronic circuit 30, with a connection line extending externally of the electronics housing H, there is provided in the field device, furthermore, a connection apparatus electrically connected with the circuit 30 and having a terminal block 10 for such a connection line as well as a connection base 20 for the terminal block. Connection base 20 is composed at least partially of an electrically insulating, synthetic material, for example a plastic.

Terminal block 10 includes a platform 100 composed at least partially of an electrically insulating, synthetic material, for example, one having a dielectric strength sufficient to meet European standard EN 60947-1. Arranged on a first side of the platform 100 forming a first connection side of the terminal block 10 is a first connection terminal T1 for a first conductor L1 of a connection line, as well as, laterally spaced from the first connection terminal, at least a second connection terminal T2 for a second conductor L2 of the connection line. Arranged on a second side of the platform forming a second connection side of the terminal block 10 are additionally a first connection contactor J1, for example, one embodied as a contact pin or contact jack, as well as, laterally spaced from the first connection contactor, a second connection contactor J2, for example, one embodied as a contact pin or contact jack.

The connection base 20 forming for practical purposes a receptacle for the terminal block 10 includes likewise a platform 200 composed at least partially of an electrically insulating, synthetic material, for example, the same synthetic material as that of the platform 100 of the terminal block 10. Arranged on a first side of the platform 200 forming a first connection side of the connection base 20 are, consequently, a first connection contactor P1 complementary to the connection contactor J1 of the terminal block 10 as well as, laterally spaced from said connection contactor P1, a connection contactor P2 correspondingly complementary to the connection contactor J2 of the terminal block 10. Each of the two connection contactors P1, P2 of the connection base can, such as schematically shown in FIG. 1, each be directly electrically connected with the respectively complementary output contactor A1, respectively A2, of the electronic circuit 30, for example, by means of material bonded, soldered connections. Output contactors A1, A2 are formed, for example, as conductive traces on a circuit board 300.

Especially, terminal block 10 and connection base 20 are, furthermore, adapted (while forming, for example, based on a plugged contact, a galvanic connection between the connection contactor J1 of the terminal block 10 and the complementary connection contactor P1 of the connection base 20 as well as between the connection contactor J2 of the terminal block 10 and the complementary connection contactor P2 of the connection base 20) to be able to be connected mechanically with one another, especially releasably, respectively to be correspondingly connected with one another.

For the mentioned case, in which the circuit output 30A is formed by means of a bipolar transistor, so that the connection contactor A1 is formed by means of a collector connection and the connection contactor A2 is formed by means of an emitter-connection, then, as a result, as directly evident from FIG. 1, the collector-connection of the bipolar transistor is electrically connected with the connection contactor P1 of the connection base, consequently via first resistance element R1 with the connection terminal T1 of the terminal block, respectively the emitter connection of the bipolar-transistor is electrically connected with the connection contactor P2 of the connection base, consequently with the connection terminal T2 of the terminal block. For the other mentioned case, in which the circuit output 30A is formed by means of a field effect transistor, so that the connection contactor A1 is formed by means of a drain connection and the connection contactor A2 is formed by means of a source connection, then, as a result, as directly evident from FIG. 3, the drain connection of the field effect transistor is electrically connected with the connection contactor P1 of the connection base, consequently via resistance element R1 with the connection terminal T1 of the terminal block, respectively the source connection of the field effect-transistor is electrically connected with the connection contactor P2 of the connection base, consequently with the connection terminal T2 of the terminal block.

In the case of the terminal block 10 of the invention, respectively the connection system formed therewith, consequently in the case of the field device formed therewith, a first resistance element R1 as well as a second resistance element R2 are arranged within the platform 100. Particularly for the purpose of the forming a switch output conforming to the above mentioned European standard EN 60947-5-6:2000, as schematically presented in FIG. 1, a first connection of the resistance element R1, for example, one also embedded in electrically insulating, synthetic material, is electrically connected with the connection terminal T1 of the terminal block 100 and a second connection of said resistance element R1 is electrically connected with the connection contactor J1 of the terminal block 100. Furthermore, a first connection of the resistance element R2, for example, one likewise embedded in electrically insulating, synthetic material, is, such as schematically presented in FIG. 1, electrically connected with the connection contactor J1 or, such as schematically presented in FIG. 2, with the connection terminal T1, of the terminal block 100, while a second connection of the resistance element R2 is electrically connected both with the connection terminal T2 as well as also with the connection contactor J2 of the terminal block 100. As a result, the resistance element R1 forms a series resistance, which limits electrical current flowing during operation through the connection terminals T1, T2, consequently electrical current flowing in the circuit output 30A, and the resistance element R2 forms accordingly a parallel resistance enabling during operation a permanent electrical current flow in the circuit output 30A.

In an embodiment of the invention, the resistance element R1 has an ohmic resistance of greater than 0.9 kΩ and less than 1.1 kΩ and/or the resistance element R2 has an ohmic resistance of greater than 9 kΩ and less than 11 kΩ. Alternatively or in supplementation, the ohmic resistance of the first resistance element and the ohmic resistance second resistance element are, according to an additional embodiment of the invention, not least of all also for the purpose of assuring the electrical current level required in European standard EN 60947-5-6:2000 for the switch states corresponding to logic "0", respectively logic "1", so selected that, as a result, the resistance element R2 has an ohmic resistance, which is greater than 9-times an ohmic resistance of the resistance element R1 and less than 11-times the ohmic resistance of the resistance element R1.

The invention claimed is:

1. A field device, especially a measuring and/or switch device, comprising:
an electronics housing;
an electronic circuit electrically accommodated within said electronics housing; and
a connection apparatus accommodated within said electronics housing and electrically connected with said electronic circuit and with a connection line extending externally of said electronics housing,
said connection apparatus including a terminal block for electrically connecting a connection line including at least two conductors and said connection apparatus including a connection base for said terminal block, said connection base being composed at least partially of an electrically insulating synthetic material;
wherein the terminal block includes:
a platform composed at least partially of an electrically insulating, synthetic material;
a first connection terminal arranged on a first side of said platform forming a first connection side of the terminal block and serving for connection of a first conductor of the connection line;
at least a second connection terminal arranged on the first side of said platform, laterally spaced from said first connection terminal and serving for connection of a second conductor of the connection line;
a first connection contactor arranged on a second side of said platform forming a second connection side of said terminal block;
a second connection contactor arranged on said second side of said platform and laterally spaced from said first connection contactor;
a first resistance element arranged within said platform;
and second resistance element arranged within the platform;
a first connection of said first resistance element is electrically connected with said first connection terminal and a second connection of said first resistance element is electrically connected with said first connection contactor;
and a first connection of said second resistance element is electrically connected with said first connection terminal or with said first connection contactor and a second connection of said second resistance element is electrically connected both with said second connection terminal as well as also with said second connection contactor.

2. The field device as claimed in claim 1, wherein:
said first resistance element exhibits an ohmic resistance of greater than 0.9 kΩ and less than 1.1 kΩ; and/or
said second resistance element exhibits an ohmic resistance of greater than 9 kΩ and less than 11 kΩ; and/or
said second resistance element exhibits an ohmic resistance, which is greater than 9 times an ohmic resistance of said first resistance element and less than 11 times the ohmic resistance of said first resistance element.

3. The field device as claimed in claim 1, wherein: the synthetic material exhibits a dielectric strength sufficient to meet European standard EN 60947 1.

4. The field device as claimed in claim 1, wherein: the first connection contactor is embodied as a contact pin.

5. The field device as claimed in claim 1, wherein: the first connection contactor is embodied as a contact jack.

6. The field device as claimed in claim 1, wherein: the second connection contactor is embodied as a contact pin.

7. The field device as claimed in claim 1, wherein: the second connection contactor is embodied as a contact jack.

8. The field device as claimed in claim 1, wherein: the first resistance element is embedded in said synthetic material.

9. The field device as claimed in claim 1, wherein: the second resistance element is embedded in said synthetic material.

10. The field device as claimed in claim 1, wherein: said electronic circuit includes two connection contactors embodied, especially, in each case, at least sectionally as a conductive trace on a circuit board and/or at least sectionally as a conductive wire; a first connection contactor is electrically connected with a first connection contactor of said connection base and a second connection contactor is electrically connected with a second connection contactor of said connection base, especially by means of soldered connections.

11. The field device as claimed in claim 1, further comprising: a measuring transducer for producing at least one measurement signal dependent on a physical, measured variable to be registered.

12. The field device as claimed in claim 1, wherein: said electronic circuit includes a circuit output, especially one formed by means of a transistor and/or passive circuit output, with a first output contactor electrically connected with a first connection contactor of said connection base and with a second output contactor electrically connected with a second connection contactor of said connection base; especially in such a manner that, by means of the circuit output, said connection base and said terminal block, a switch output conforming to European standard EN 60947 5 6:2000 is formed.

13. The field device as claimed in claim 1, wherein: said electronic circuit includes a bipolar transistor with a collector connection, especially a collector connection forming a first connection contactor of said electronic circuit, and with an emitter connection, especially an emitter connection forming a second connection contactor of said electronic circuit.

14. The field device as claimed in claim 1, wherein: especially for forming a circuit output meeting European standard EN 60947 5 6:2000, the collector connection of said bipolar transistor is electrically connected with a first connection contactor of a connection base, consequently via a first resistance element with a first connection terminal of a terminal block; and the emitter connection of said bipolar transistor is electrically connected with a second connection contactor of a connection base, consequently with a second connection terminal of said terminal block.

15. The field device as claimed in claim 1, wherein: said electronic circuit includes a field effect transistor with a drain connection, especially a drain connection forming the first connection contactor of said electronic circuit, and with a source connection, especially a source connection forming the second connection contactor of said electronic circuit.

\* \* \* \* \*